United States Patent
Hsiang et al.

(10) Patent No.: US 11,004,721 B2
(45) Date of Patent: May 11, 2021

(54) MICRO DEVICE TRANSFER HEAD

(71) Applicant: ACER INCORPORATED, New Taipei (TW)

(72) Inventors: Jui-Chieh Hsiang, New Taipei (TW); Chih-Chiang Chen, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 312 days.

(21) Appl. No.: 15/919,235

(22) Filed: Mar. 13, 2018

(65) Prior Publication Data

US 2019/0206714 A1 Jul. 4, 2019

(30) Foreign Application Priority Data

Dec. 29, 2017 (TW) ................................ 106146464

(51) Int. Cl.
| | |
|---|---|
| *H01L 21/687* | (2006.01) |
| *B81C 99/00* | (2010.01) |
| *H01L 21/67* | (2006.01) |
| *H01L 21/677* | (2006.01) |
| *H01L 21/683* | (2006.01) |
| *H01L 33/00* | (2010.01) |

(52) U.S. Cl.
CPC ...... *H01L 21/68707* (2013.01); *B81C 99/002* (2013.01); *H01L 21/67144* (2013.01); *H01L 21/67712* (2013.01); *H01L 21/67721* (2013.01); *H01L 21/6831* (2013.01); *H01L 33/005* (2013.01)

(58) Field of Classification Search
CPC ......... H01L 21/68707; H01L 21/67144; H01L 21/67712; H01L 21/67721; H01L 21/6831; B81C 99/002
USPC .................................. 29/744, 729, 700, 746
See application file for complete search history.

(56) References Cited

U.S. PATENT DOCUMENTS

| | | | | |
|---|---|---|---|---|
| 8,569,115 B1 * | 10/2013 | Golda | ..................... | B32B 38/18 |
| | | | | 438/130 |
| 2016/0293566 A1 * | 10/2016 | Golda | ..................... | H01L 24/97 |
| 2016/0329232 A1 | 11/2016 | Golda | | |

FOREIGN PATENT DOCUMENTS

| | | |
|---|---|---|
| CN | 106601661 A | 4/2017 |
| CN | 107039298 A | 8/2017 |
| CN | 107265400 A | 10/2017 |
| TW | 201430986 A | 8/2014 |

* cited by examiner

*Primary Examiner* — Peter Dungba Vo
*Assistant Examiner* — Azm A Parvez
(74) *Attorney, Agent, or Firm* — Winston Hsu

(57) ABSTRACT

A micro device transfer head includes a base arm, a first side arm, a second side arm, and an isolation layer. The first side arm, including one or multiple first electrodes, is disposed on a first surface of the base arm and located on a first end of the base arm. The second side arm, including one or multiple second electrodes, is disposed on the first surface of the base arm and located on a second end of the base arm. The isolation later is disposed on the first surface of the base arm and covers the surface of the first side arm and the second side arm.

4 Claims, 12 Drawing Sheets

MICRO DEVICE TRANSFER HEAD

CROSS REFERENCE TO RELATED APPLICATION

This application claims priority of Taiwan Application No. 106146464 filed on 2017 Dec. 29.

BACKGROUND OF THE INVENTION

1. Field of the Invention

The present invention is related to a micro device transfer head, and more particularly, to a micro device transfer head capable of mass-transferring micro LEDs rapidly and efficiently.

2. Description of the Prior Art

Compared to traditional incandescent bulbs, light-emitting diodes (LEDs) are advantageous in low power consumption, long lifetime, small size, no warm-up time, fast reaction speed, and the ability to be manufactured as small or array devices. In addition to outdoor displays, traffic signs, and liquid crystal display (LCD) backlight for various electronic devices such as mobile phones, notebook computers or personal digital assistants (PDAs), LEDs are also widely used as indoor/outdoor lighting devices in place of fluorescent of incandescent lamps. An LED may adopt front-emission micro devices or side-emission micro devices. Front-emission micro devices provide wider viewing angles, but have poor performances in emission efficiency and half wavelength. Side-emission micro devices excel in high emission efficiency and better half wavelength, but can only provide narrower viewing angles.

The size of traditional LED arrays is the dimension of millimeters (mm). The size of micro LED arrays may be reduced to the dimension of micrometers (µm) while inheriting the same good performances regarding power consumption, brightness, resolution, color saturation, reaction speed, life time and efficiency. In a micro LED manufacturing process, a thin-film, miniaturized and array design is adopted so that multiple micro LEDs are fabricated in the dimension of merely 1-250 µm. Next, these micro LEDs are mass transferred to be disposed on another circuit board. Protection layers and upper electrodes may be formed in a physical deposition process before packaging the upper substrate.

Therefore, there is a need for a micro device transfer head array capable of mass-transferring micro LEDs rapidly and efficiently.

SUMMARY OF THE INVENTION

The present invention provides a micro device transfer head which includes a base arm, a first side arm, a second side arm and an isolation layer. The first base arm includes a first surface and a second surface. The first side arm includes one or multiple first electrodes and is disposed on the first surface of the base arm at a first end of the base arm. The second side arm includes one or multiple second electrodes and is disposed on the first surface of the base arm at a second end of the base arm. The isolation layer is disposed on the first surface of the base arm and covers a surface of the first side arm and a surface of the second side arm.

The present invention further provides a method of transferring a micro device using a micro device transfer head. The micro device transfer head includes a first base arm, a first side arm and a second side arm, and the micro device is fabricated on a substrate. The method includes moving the first side arm within a sensing range of the micro device, charging the first side arm for drawing the micro device away from the substrate to move towards a space between the first side arm and the second side arm, and shortening a distance between the first side arm and the second side arm for clamping the micro device.

These and other objectives of the present invention will no doubt become obvious to those of ordinary skill in the art after reading the following detailed description of the preferred embodiment that is illustrated in the various figures and drawings.

DETAILED DESCRIPTION

FIGS. 1~6 are structural diagrams illustrating micro device transfer head arrays 101~106 according to embodiments of the present invention. Each of the micro device transfer head arrays 101~106 includes a plurality of transfer heads (only two transfer heads are depicted for illustrative purpose) for transferring a predetermined amount of micro devices to a substrate. Each transfer head includes a first side arm 10, a second side arm 20, a base arm 30, and an isolation layer 40. The first side arm 10 and the second side arm 20 are structures extending from both ends of the base arm 30, respectively. The space between the first side arm 10 and the second side arm 20 may provide room to clamp and accommodate a micro device. The isolation layer 40 covers the surface of the first side arm 10 and the second side arm 20, as well as covers one surface of the base arm 30. The first end of first side arm 10 and the first end of the second side arm 20 are contact ends to the base arm 30, while the second end of first side arm 10 and the second end of the second side arm 20 are clamping ends. The distance between the first end of first side arm 10 and the first end of the second side arm 20 is represented by d1, while the distance between the second end of first side arm 10 and the second end of the second side arm 20 is represented by d2.

Figure 1:
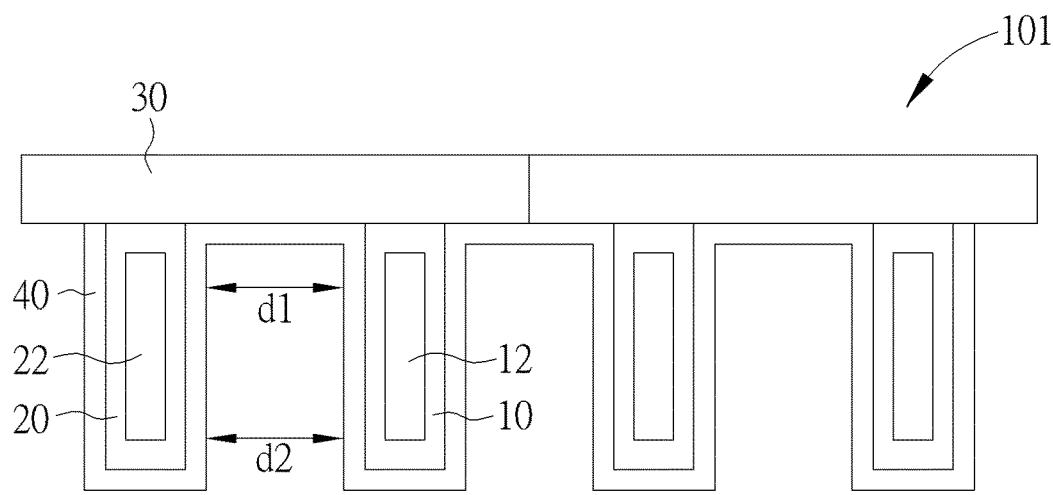
FIG. 1 is a structural diagram illustrating a micro device transfer head array according to an embodiment of the present invention.
Figure 2:
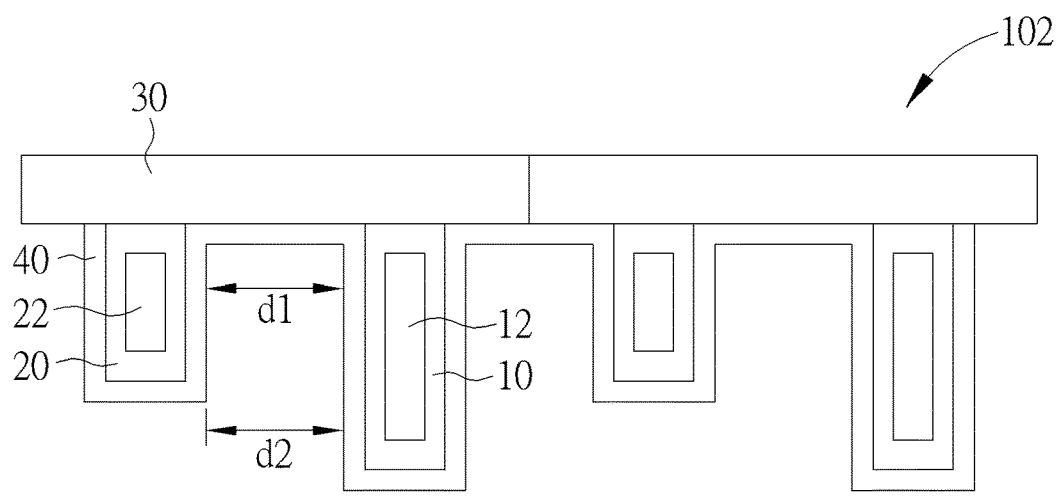
FIG. 2 is a structural diagram illustrating a micro device transfer head array according to another embodiment of the present invention.
Figure 3:
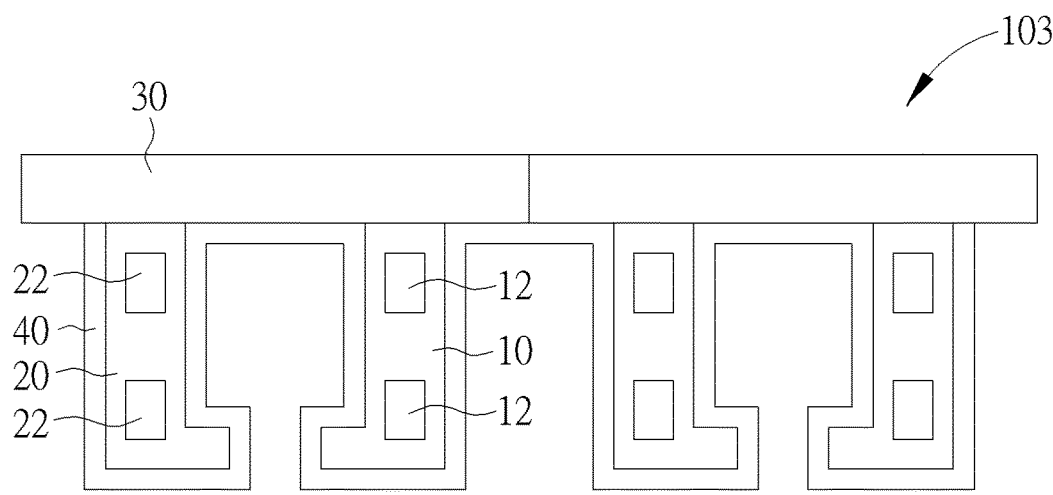
FIG. 3 is a structural diagram illustrating a micro device transfer head array according to another embodiment of the present invention.

In the embodiments illustrated in FIGS. 1-3, the first side arm 10 includes one or multiple electrodes 12 and the second side arm 20 includes one or multiple electrodes 22. In the micro device transfer head array 101 depicted in FIG. 1, the first side arm 10 and the second side arm 20 are of the same length. In the micro device transfer head array 102 depicted in FIG. 2, the first side arm 10 is longer than the second side arm 20. In the micro device transfer head array 103 depicted in FIG. 3, the first side arm 10 and the second side arm 20 are of the same length and both include a hook-shaped second end.

Figure 4:
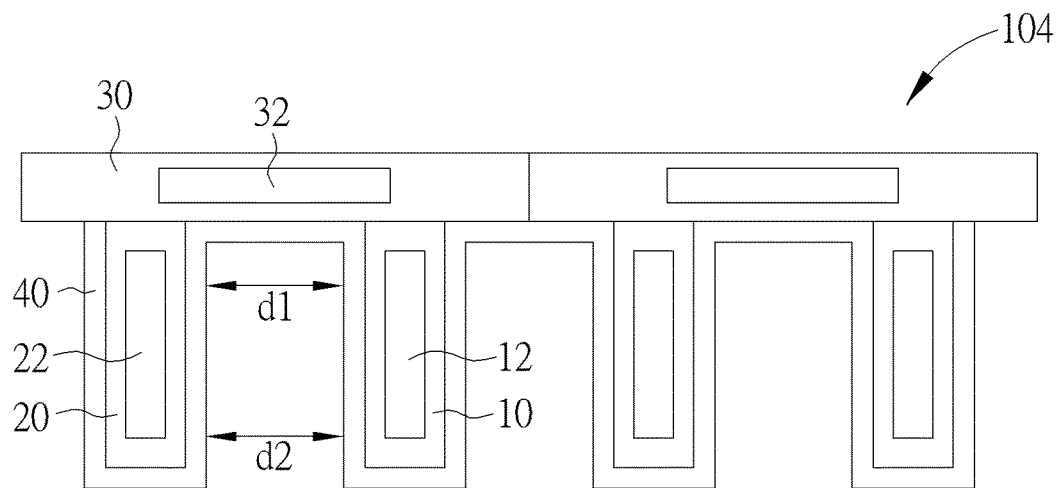
FIG. 4 is a structural diagram illustrating a micro device transfer head array according to another embodiment of the present invention.
Figure 5:
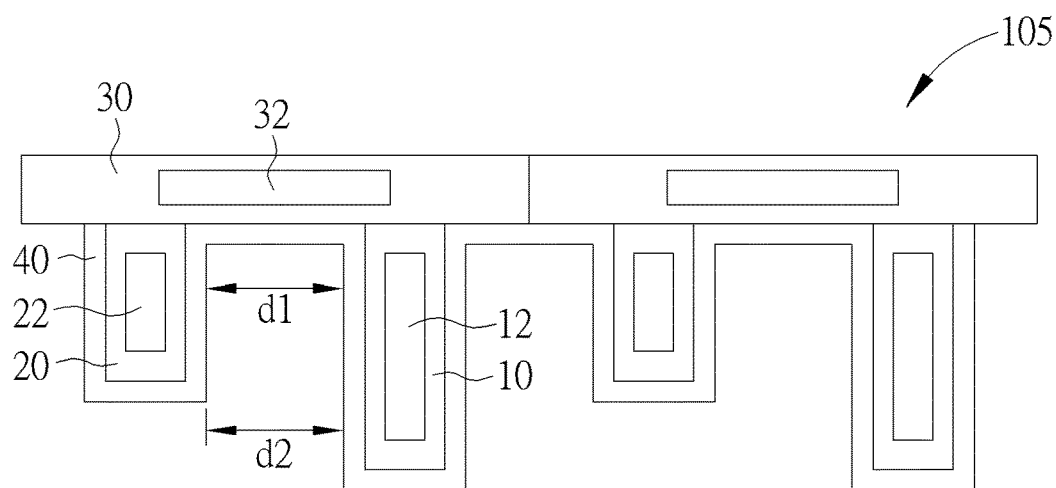
FIG. 5 is a structural diagram illustrating a micro device transfer head array according to another embodiment of the present invention.
Figure 6:
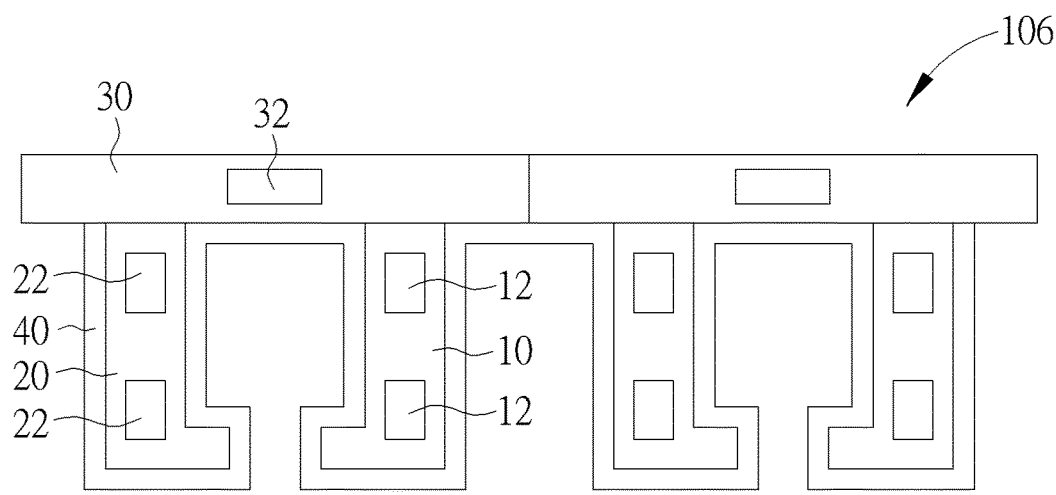
FIG. 6 is a structural diagram illustrating a micro device transfer head array according to another embodiment of the present invention.

In the embodiments illustrated in FIGS. 4-6, the first side arm 10 includes one or multiple electrodes 12, the second side arm 20 includes one or multiple electrodes 22, and the base arm 30 includes one or multiple electrodes 32. In the micro device transfer head array 104 depicted in FIG. 4, the first side arm 10 and the second side arm 20 are of the same length. In the micro device transfer head array 105 depicted in FIG. 5, the first side arm 10 is longer than the second side arm 20. In the micro device transfer head array 106 depicted in FIG. 6, the first side arm 10 and the second side arm 20 are of the same length and both include a hook-shaped second end.

Figure 7:
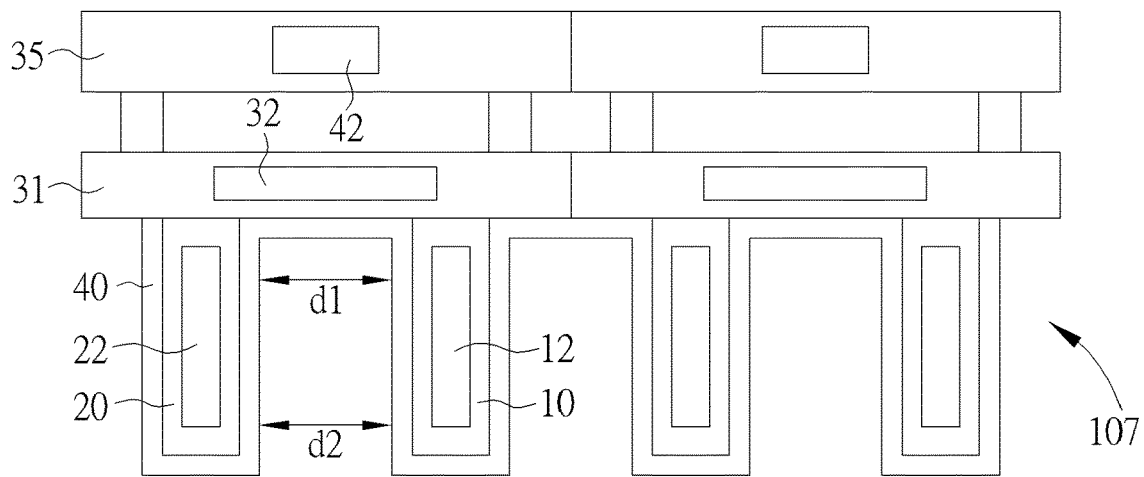
FIG. 7 is a structural diagram illustrating a micro device transfer head array according to another embodiment of the present invention.
Figure 8:
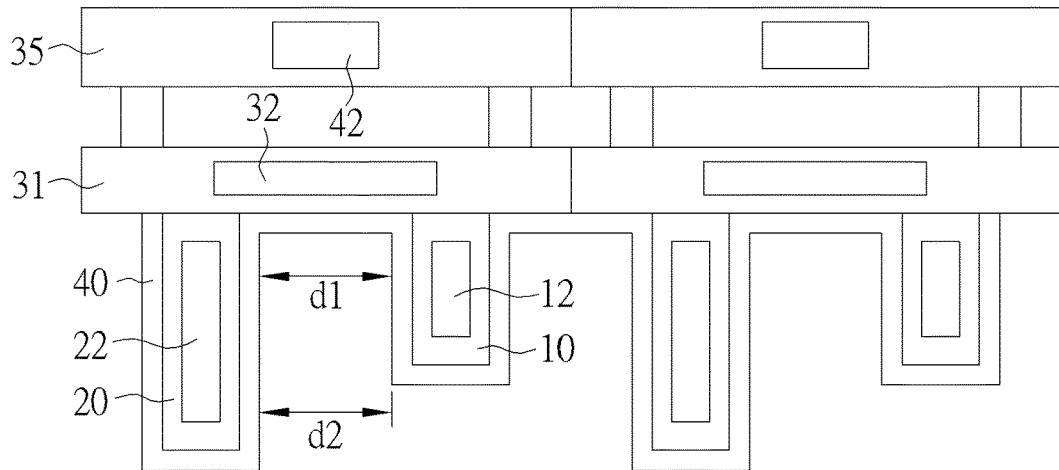
FIG. 8 is a structural diagram illustrating a micro device transfer head array according to another embodiment of the present invention.
Figure 9:
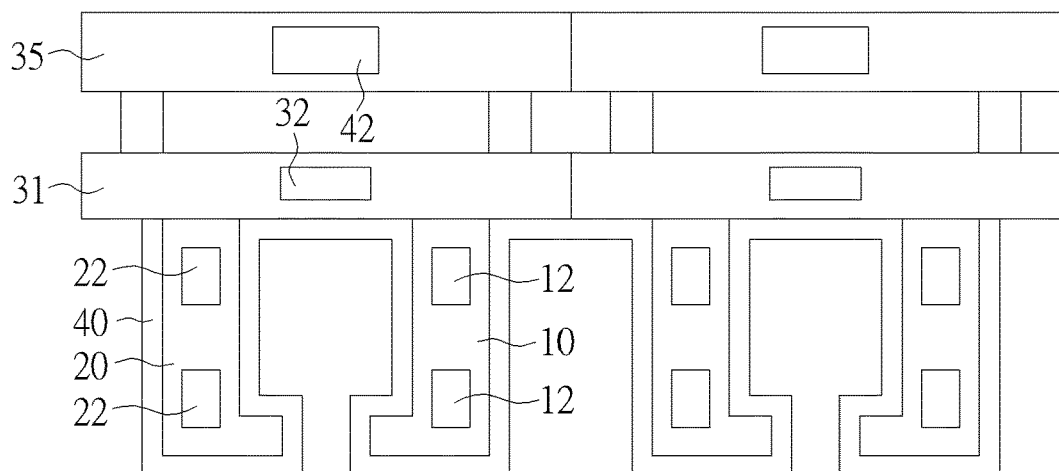
FIG. 9 is a structural diagram illustrating a micro device transfer head array according to another embodiment of the present invention.

FIGS. 7~9 are structural diagrams illustrating micro device transfer head arrays 107~109 according to embodiments of the present invention. Each of the micro device transfer head arrays 107~109 includes a plurality of transfer heads (only two transfer heads are depicted for illustrative purpose) for transferring a predetermined amount of micro devices to a substrate. Each transfer head includes a first side arm 10, a second side arm 20, two base arms 31 and 35, and an isolation layer 40. The first side arm 10 and the second side arm 20 are structures extending from both ends of the base arm 31, respectively. The space between the first side arm 10 and the second side arm 20 may provide room to clamp and accommodate a micro device. The isolation layer 40 covers the surface of the first side arm 10 and the second side arm 20, as well as covers a first surface of the base arm 31. The base arm 35 is disposed on a second surface of the base arm 31. The space between the base arm 31 and the base arm 35 may provide deformation room for operating the micro device transfer head arrays 107~109, which will be illustrated in detail in subsequent paragraphs. The first end of first side arm 10 and the first end of the second side arm 20 are contact ends to the base arm 31, while the second end of first side arm 10 and the second end of the second side arm 20 are clamping ends. The distance between the first end of first side arm 10 and the first end of the second side arm 20 is represented by d1, while the distance between the second end of first side arm 10 and the second end of the second side arm 20 is represented by d2.

In the embodiments illustrated in FIGS. 7~9, the first side arm 10 includes one or multiple electrodes 12, the second side arm 20 includes one or multiple electrodes 22, the base arm 31 includes one or multiple electrodes 32, and the base arm 35 includes one or multiple sensing elements 42. The one or multiple sensing elements 42 may be one or multiple electrodes or electromagnetic coils. In the micro device transfer head array 107 depicted in FIG. 7, the first side arm 10 and the second side arm 20 are of the same length. In the micro device transfer head array 108 depicted in FIG. 8, the first side arm 10 is shorter than the second side arm 20. In the micro device transfer head array 109 depicted in FIG. 9, the first side arm 10 and the second side arm 20 are of the same length and both include a hook-shaped second end.

Figure 10:
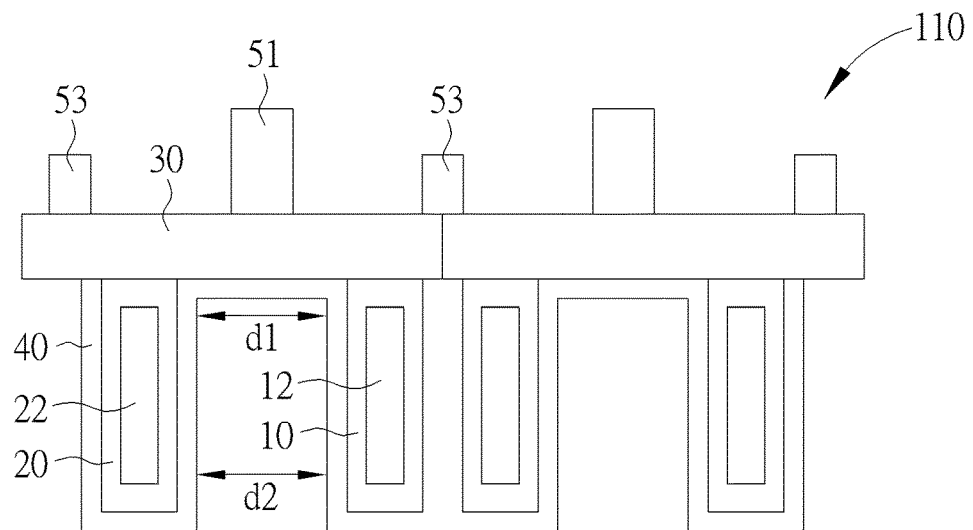
FIG. 10 is a structural diagram illustrating a micro device transfer head array according to another embodiment of the present invention.
Figure 11:
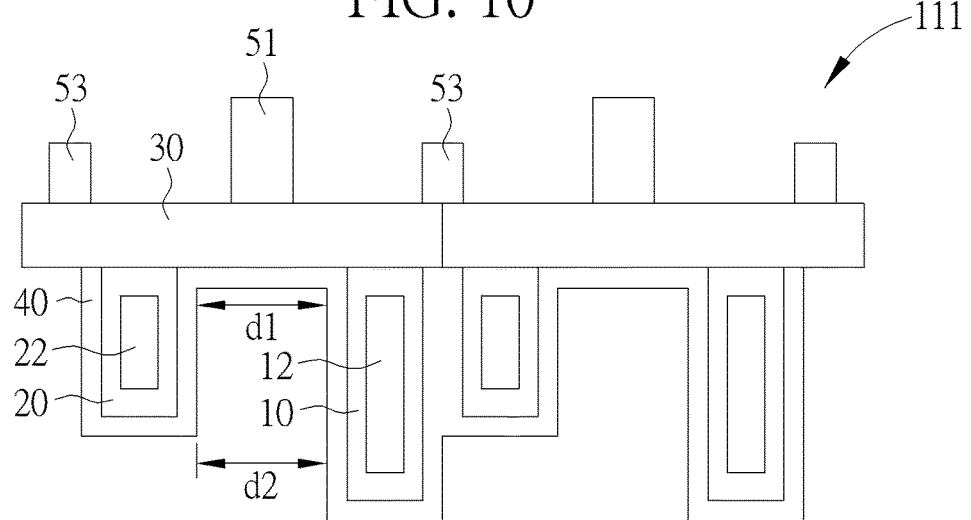
FIG. 11 is a structural diagram illustrating a micro device transfer head array according to another embodiment of the present invention.
Figure 12:
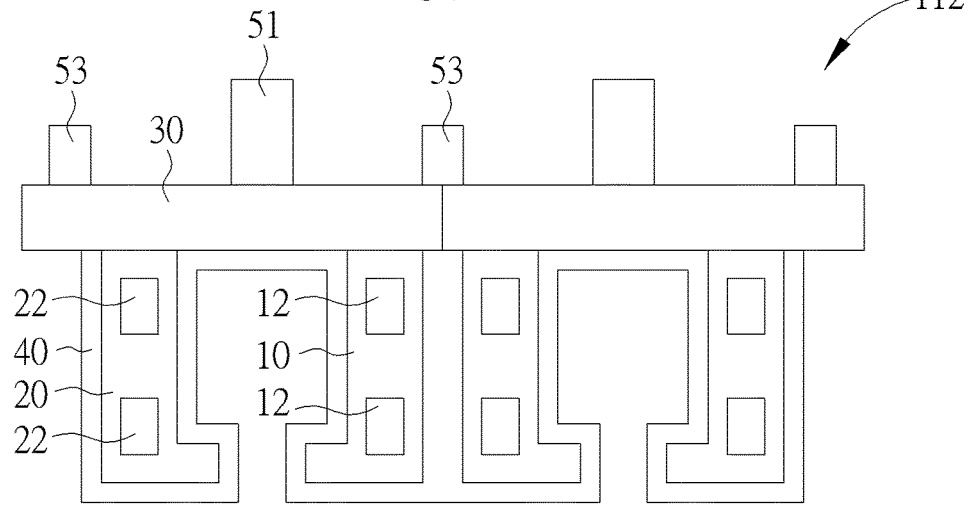
FIG. 12 is a structural diagram illustrating a micro device transfer head array according to another embodiment of the present invention.
Figure 13A:
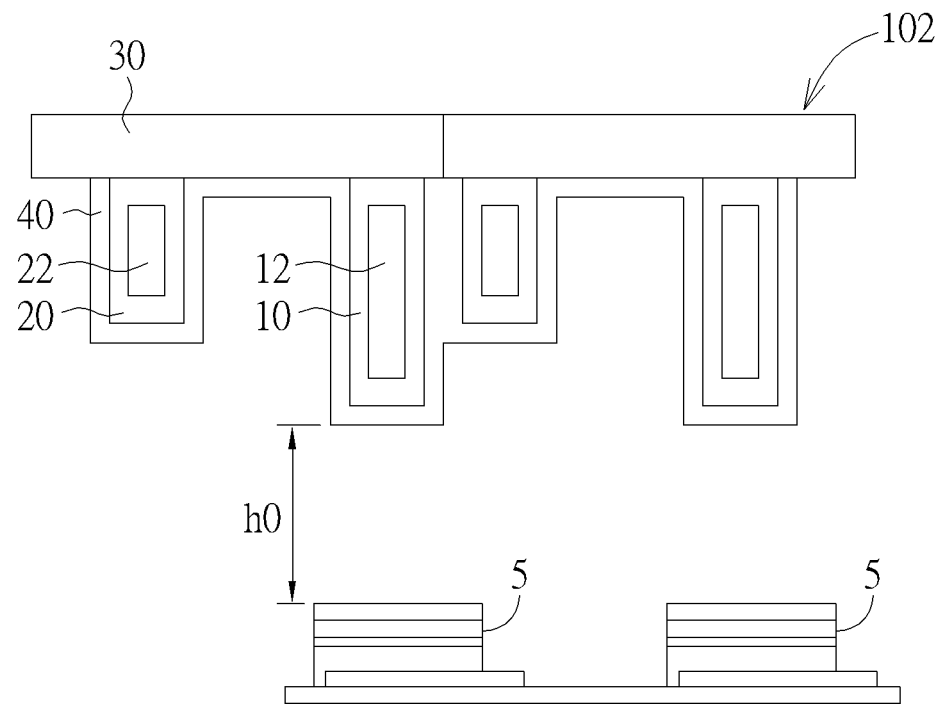
FIGS. 13A-13E are diagrams illustrating the operation of a micro device transfer head array according to an embodiments of the present invention.
Figure 13B:
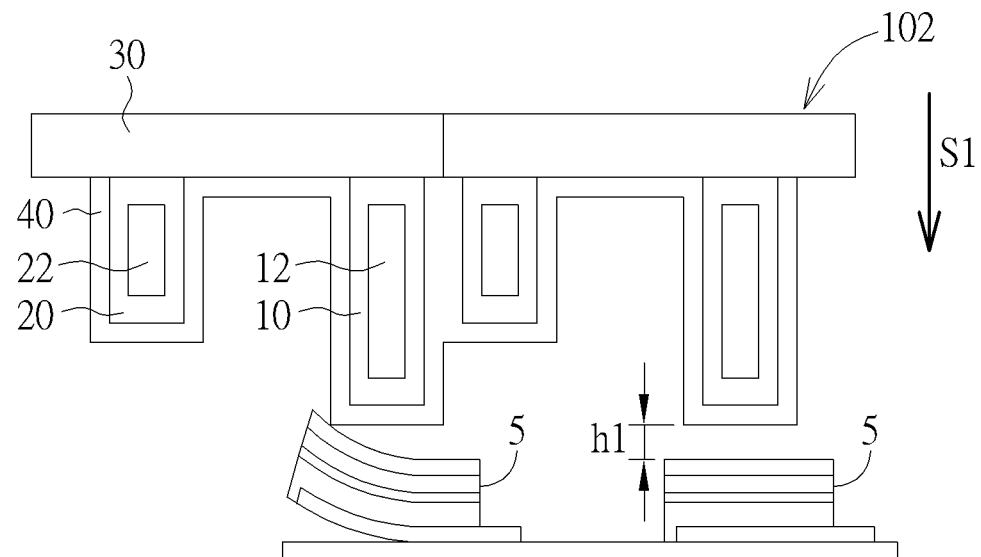
Figure 13C:
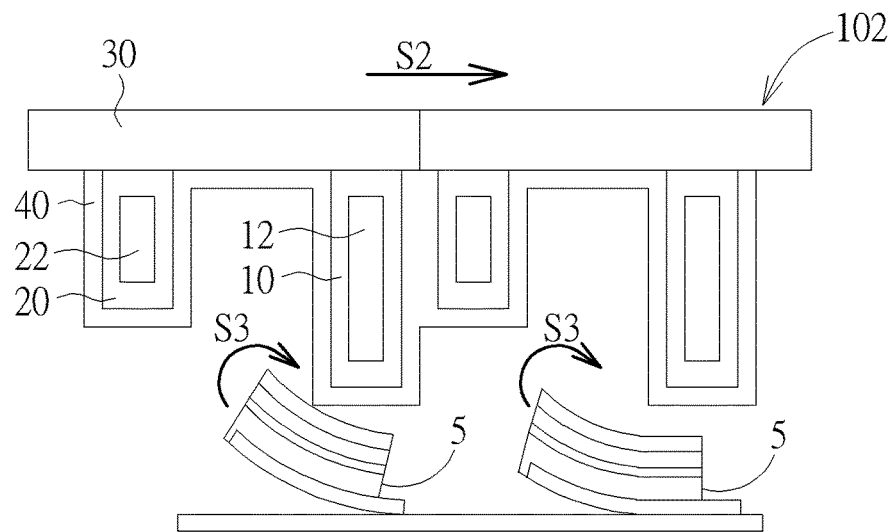
Figure 13D:
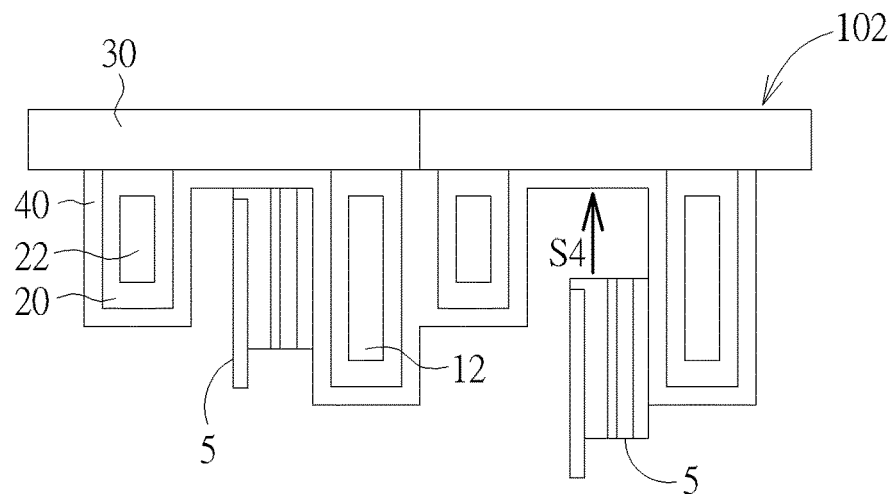
Figure 13E:
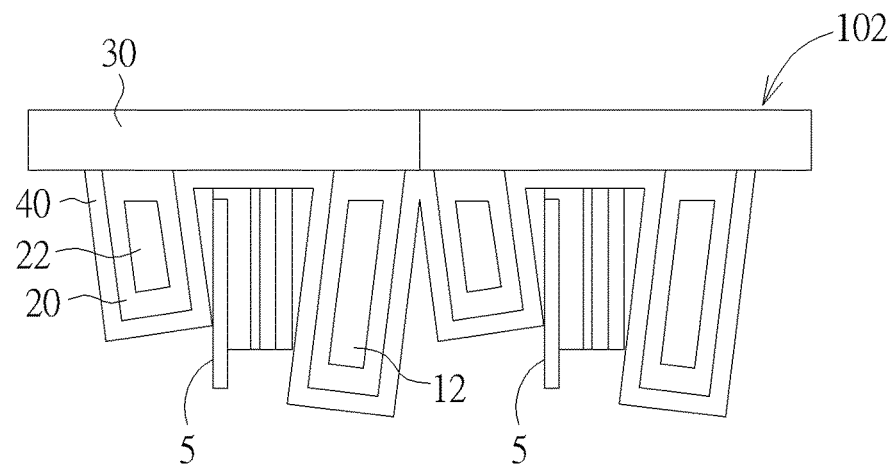
Figure 14A:
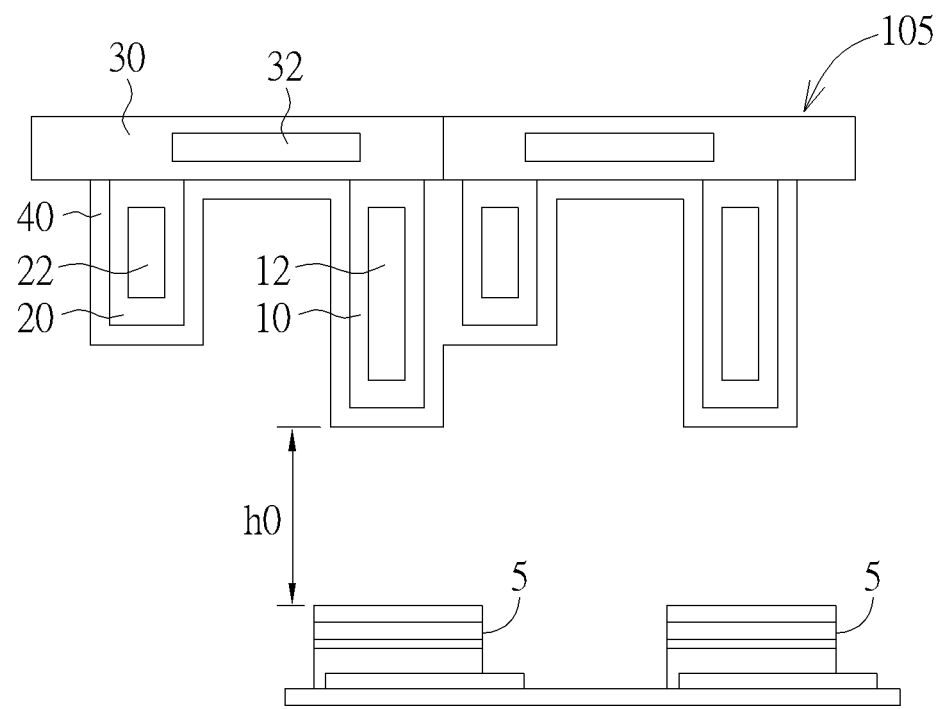
FIGS. 14A-14E are diagrams illustrating the operation of a micro device transfer head array according to another embodiments of the present invention.
Figure 14B:
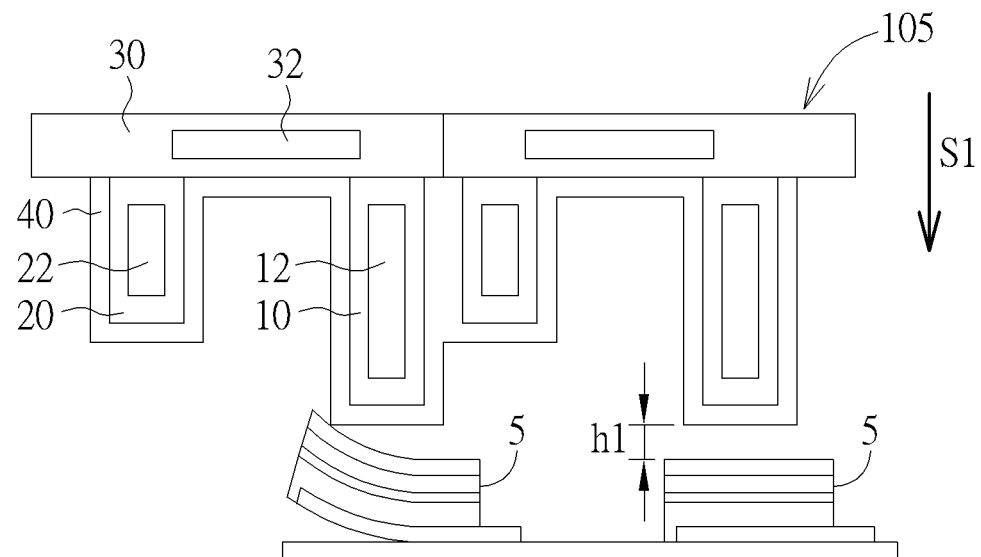
Figure 14C:
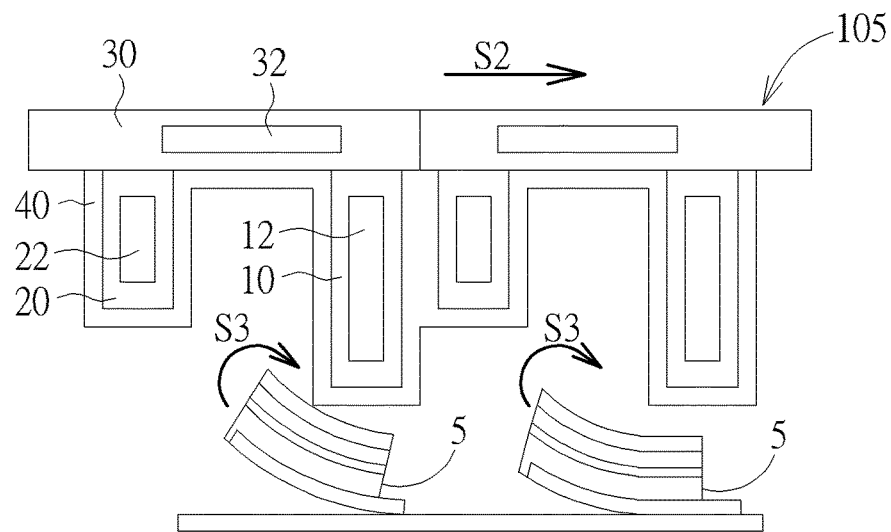
Figure 14D:
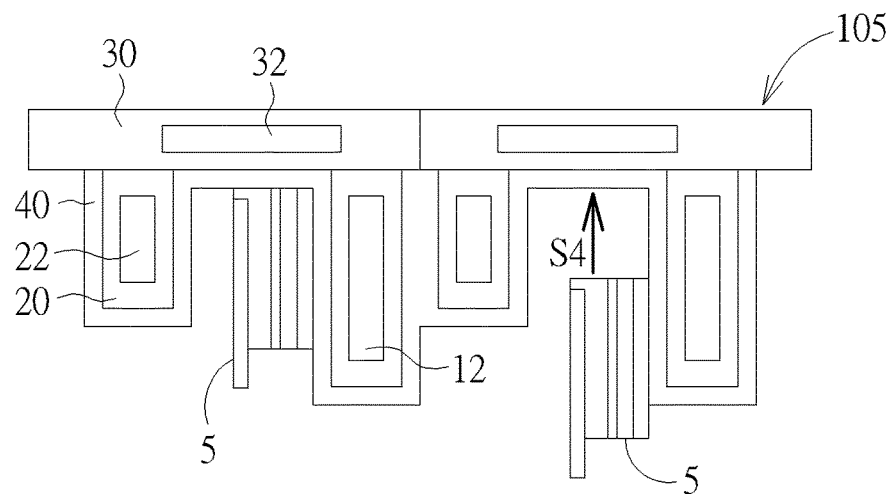
Figure 14E:
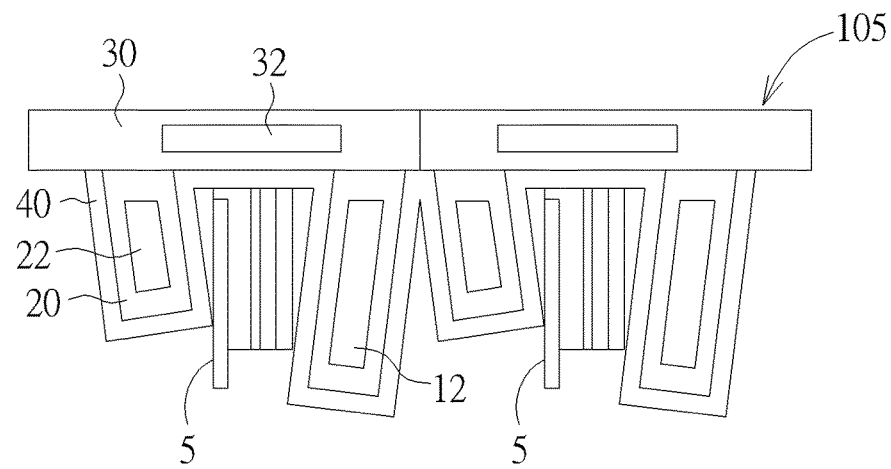
Figure 15A:
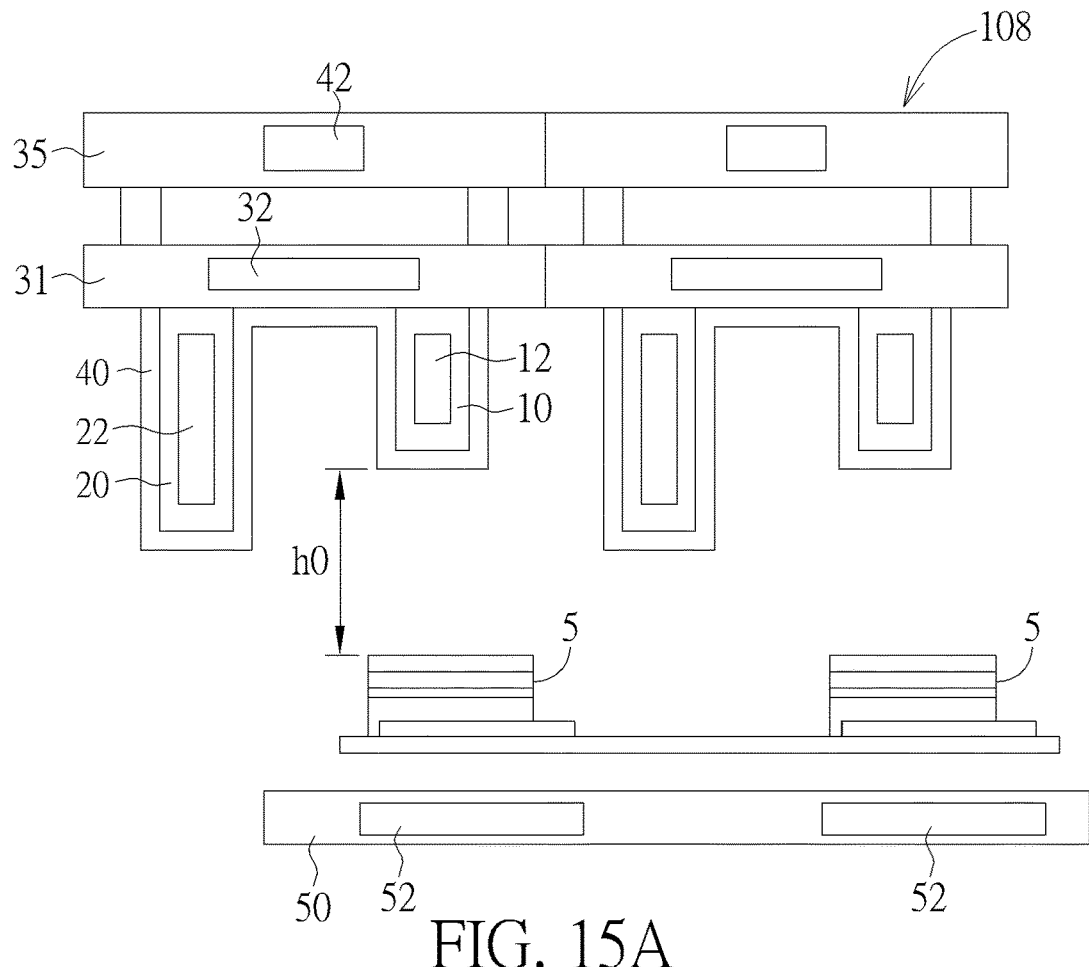
FIGS. 15A-15E are diagrams illustrating the operation of a micro device transfer head array according to another embodiments of the present invention.
Figure 15B:
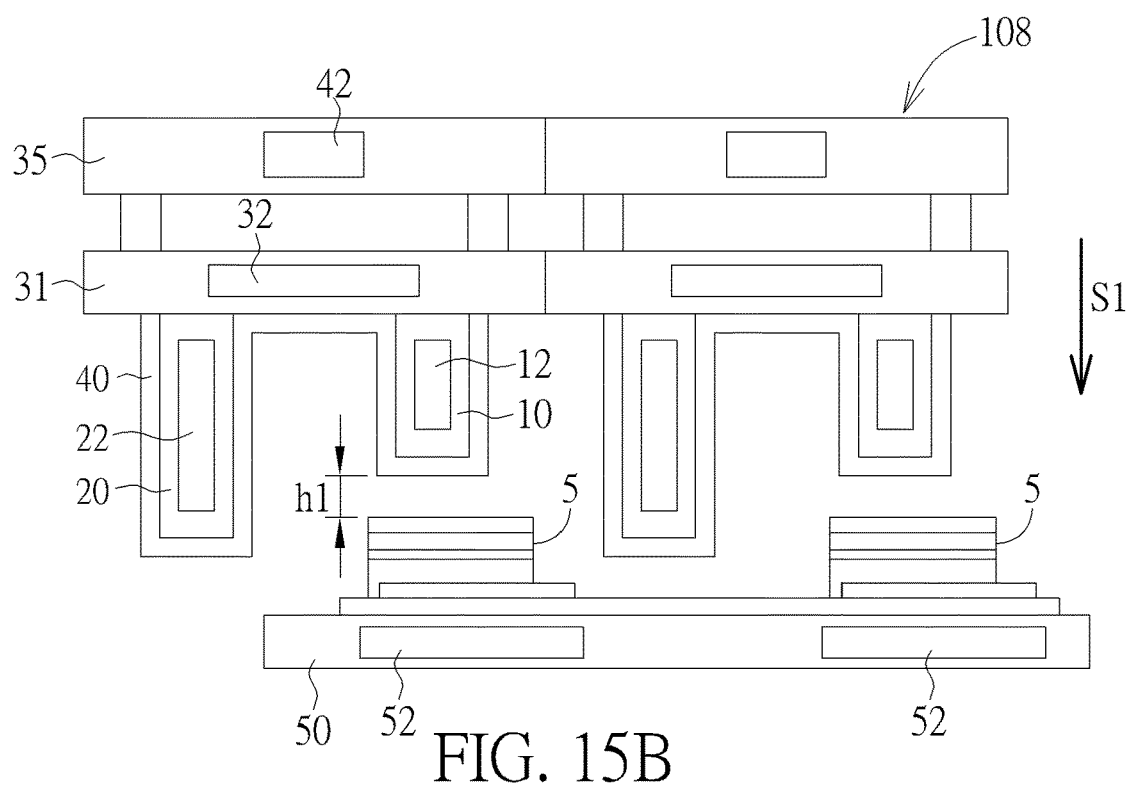
Figure 15C:
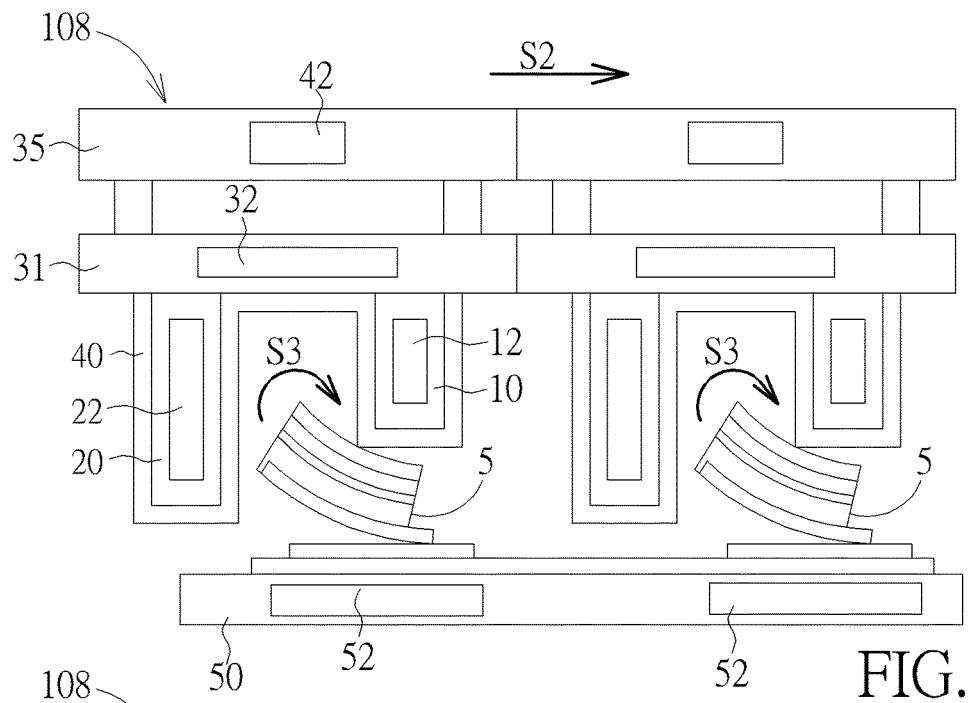
Figure 15D:
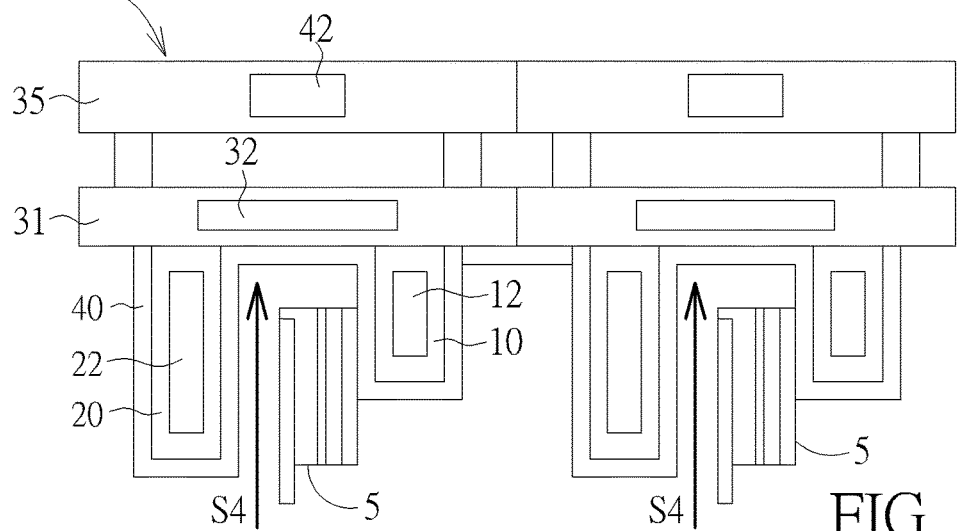
Figure 15E:
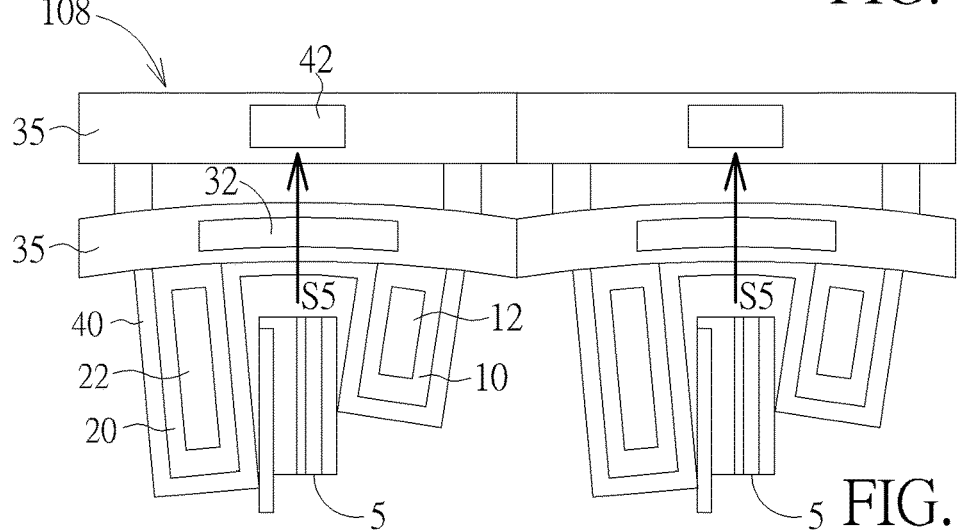
Figure 16A:
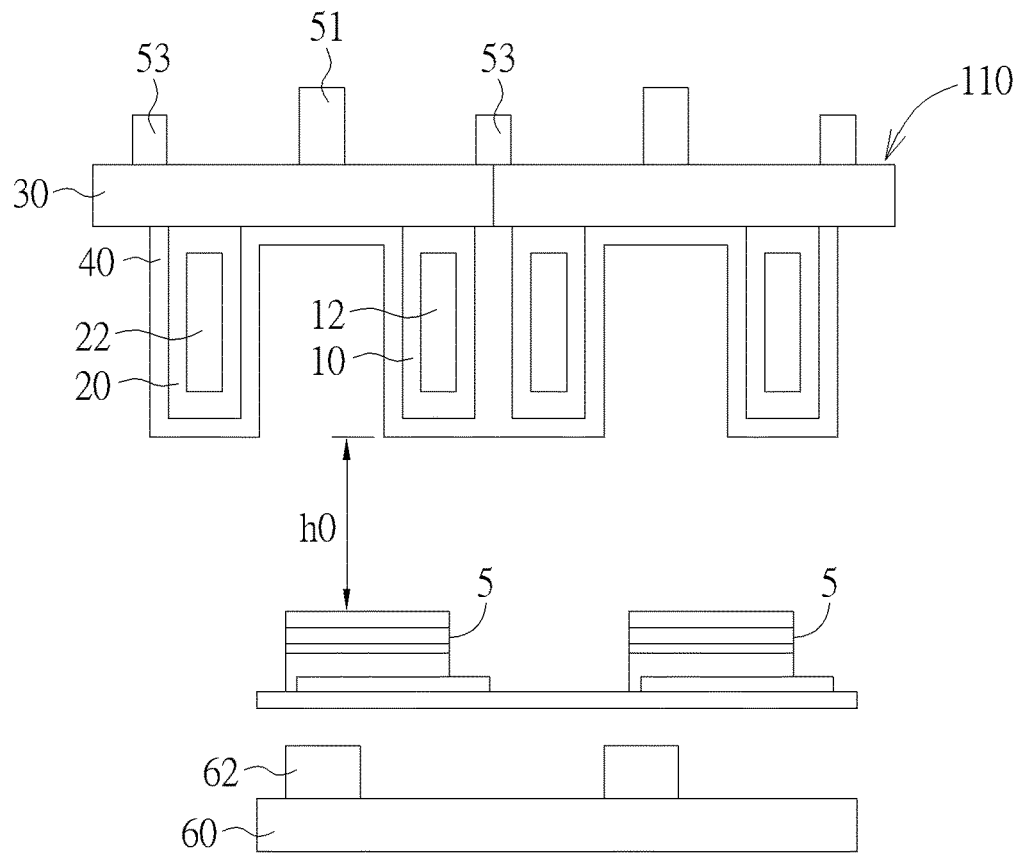
FIGS. 16A-16D are diagrams illustrating the operation of a micro device transfer head array according to another embodiment of the present invention.
Figure 16B:
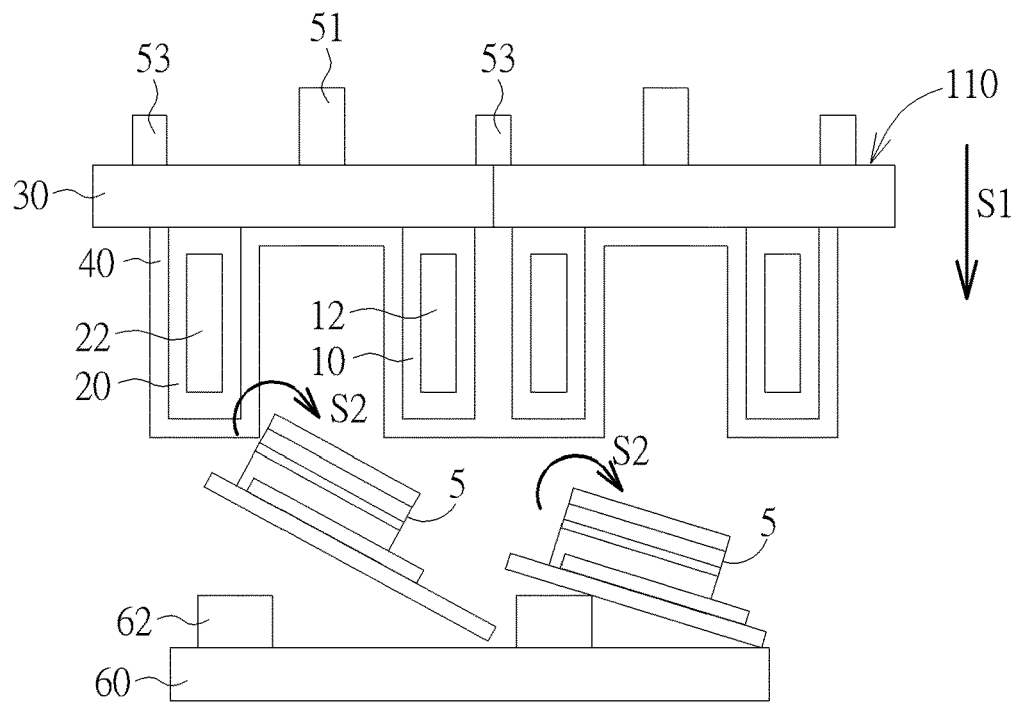
Figure 16C:
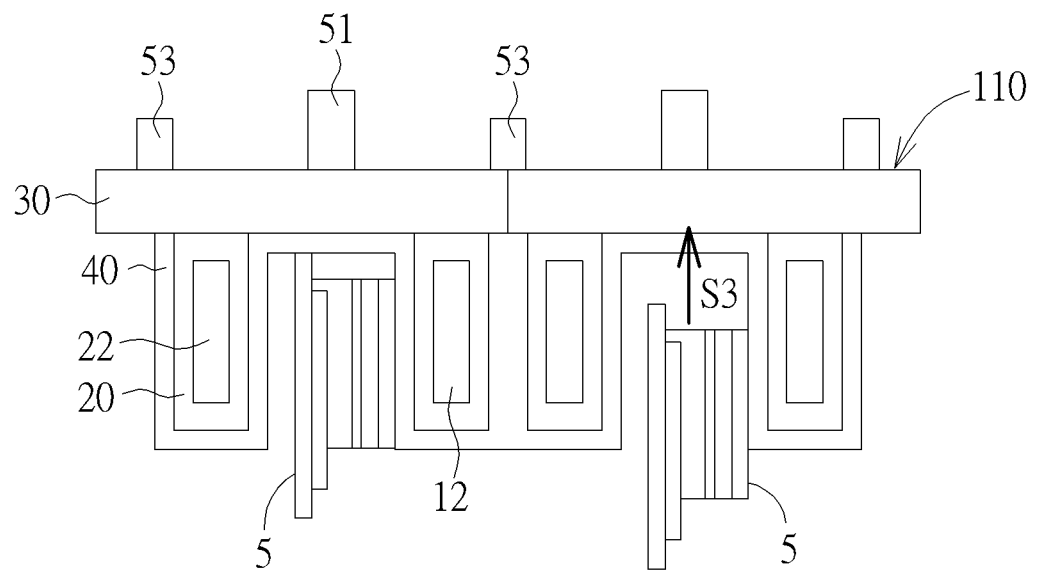
Figure 16D:
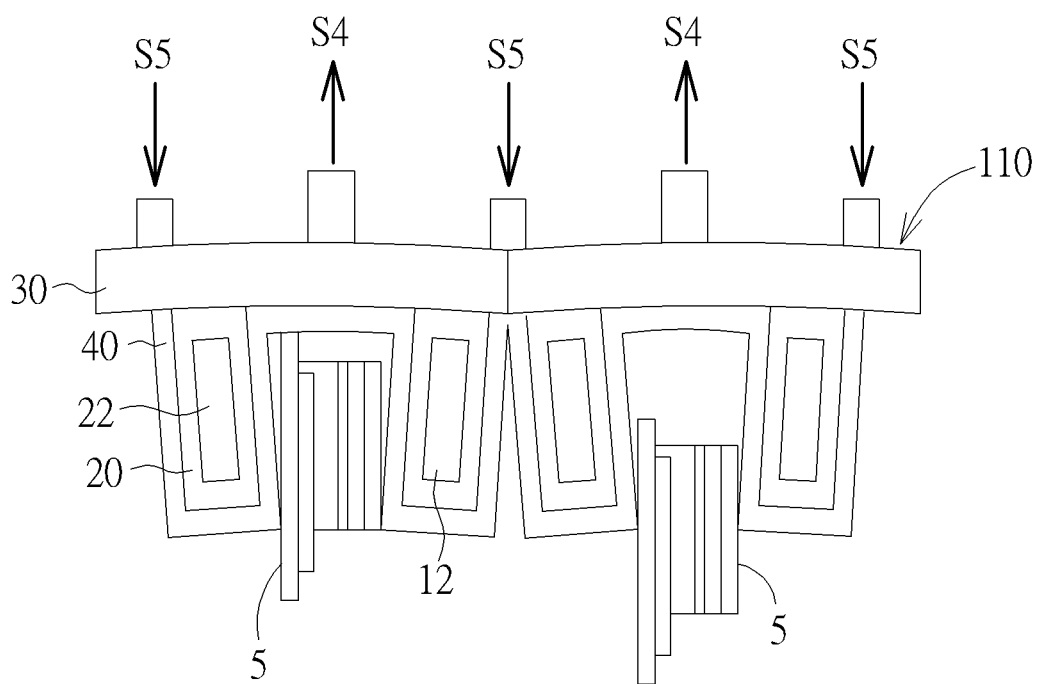

FIGS. 10~12 are structural diagrams illustrating micro device transfer head arrays 110~112 according to embodiments of the present invention. Each of the micro device transfer head arrays 110~112 includes a plurality of transfer heads (only two transfer heads are depicted for illustrative purpose) for transferring a predetermined amount of micro devices to a substrate. Each transfer head includes a first side arm 10, a second side arm 20, a base arm 30, an isolation layer 40, and adjusting arms 51 and 53. The first side arm 10 and the second side arm 20 are structures extending from both ends of the base arm 30, respectively. The space between the first side arm 10 and the second side arm 20 may provide room to clamp and accommodate a micro device. The isolation layer 40 covers the surface of the first side arm 10 and the second side arm 20, as well as covers a first surface of the base arm 30. The adjusting arms 51 and 53 are disposed on a second surface of the base arm 30, wherein the location of each adjusting arm 51 corresponds to the space between the first side arm 10 and the second side arm 20 in each transfer head, while the location of each adjusting arm 53 corresponds to the space between each transfer head. The first end of first side arm 10 and the first end of the second side arm 20 are contact ends to the base arm 30, while the second end of first side arm 10 and the second end of the second side arm 20 are clamping ends. The distance between the first end of first side arm 10 and the first end of the second side arm 20 is represented by d1, while the distance between the second end of first side arm 10 and the second end of the second side arm 20 is represented by d2.

In the embodiments illustrated in FIGS. 10~12, the first side arm 10 includes one or multiple electrodes 12, and the second side arm 20 includes one or multiple electrodes 22. In the micro device transfer head array 110 depicted in FIG. 110, the first side arm 10 and the second side arm 20 are of the same length. In the micro device transfer head array 111 depicted in FIG. 11, the first side arm 10 is longer than the second side arm 20. In the micro device transfer head array 112 depicted in FIG. 12, the first side arm 10 and the second side arm 20 are of the same length and both include a hook-shaped second end.

FIGS. 13A-13E are diagrams illustrating the operation of the micro device transfer head arrays 101~103 according to embodiments of the present invention. For illustrative purpose, FIGS. 13A-13E depict the 5-state operation of the micro device transfer head array 102. In the initial first state depicted in FIG. 13A, the electrodes 12 and 22 are not charged, and the distance between the first side arm 10 and its corresponding micro device 5 is h0. In the second state depicted in FIG. 13B, the electrodes 12 is charged, and the micro device transfer head array 102 is moved within the sensing range of the corresponding micro device 5 (as indicated by arrow S1), wherein the distance between the first side arm 10 and its corresponding micro device 5 is h1 (h1<h0). In the third state depicted in FIG. 13C, the micro device transfer head array 102 is moved in the lateral direction (as indicated by arrow S2) so that the charged electrode 12 may draw the corresponding micro device 5 away from the substrate to move towards the space between the first side arm 10 and the second side arm 20 (as indicated by arrow S3). In the fourth state depicted in FIG. 13D, with the lateral movement of the micro device transfer head array 102 and under the attraction force induced by the charged electrode 12, the corresponding micro device 5 may be drawn into the space between the first side arm 10 and the second side arm 20 (as indicated by arrow S4). In the fifth state depicted in FIG. 13E, when the electrodes 12 and 22 are then charged by voltages of opposite polarities, the induced attraction force shortens the distance between the second end of the first side arm 10 and the second end of the second side arm 20 (d2>d1), thereby clamping the corresponding micro device 5 steadily.

FIGS. 14A-14E are diagrams illustrating the operation of the micro device transfer head arrays 104~106 according to embodiments of the present invention. For illustrative purpose, FIGS. 14A-14E depict the 5-state operation of the micro device transfer head array 105. In the initial first state depicted in FIG. 14A, the electrodes 12 and 22 are not charged, and the distance between the first side arm 10 and its corresponding micro device 5 is h0. In the second state depicted in FIG. 14B, the electrodes 12 is charged, and the micro device transfer head array 105 is moved within the sensing range of the corresponding micro device 5 (as indicated by arrow S1), wherein the distance between the first side arm 10 and the corresponding micro device 5 is h1 (h1<h0). In the third state depicted in FIG. 14C, the micro device transfer head array 105 is moved in the lateral direction (as indicated by arrow S2) so that the charged electrode 12 may draw the corresponding micro device 5 away from the substrate to move towards the space between the first side arm 10 and the second side arm 20 (as indicated by arrow S3). In the fourth state depicted in FIG. 14D, with the lateral movement of the micro device transfer head array 105 and under the attraction force induced by the charged electrode 12, the corresponding micro device 5 may be drawn into the space between the first side arm 10 and the second side arm 20. Meanwhile, the electrode 32 is charged to further draw the corresponding micro device 5 towards the base arm 30 to fully be accommodated inside the space between the first side arm 10 and the second side arm 20 (as indicated by arrow S4). In the fifth state depicted in FIG. 14E, when the electrodes 12 and 22 are then charged by voltages of opposite polarities, the induced attraction force shortens the distance between the second end of the first side arm 10 and the second end of the second side arm 20 (d2>d1), thereby clamping the corresponding micro device 5 steadily.

FIGS. 15A-15E are diagrams illustrating the operation of the micro device transfer head arrays 107~109 according to embodiments of the present invention. For illustrative purpose, FIGS. 15A-15E depict the 5-state operation of the micro device transfer head array 108 with an auxiliary board 50. The auxiliary board 50 includes one or multiple sensing elements 52 each associated with a corresponding micro device 5. In the initial first state depicted in FIG. 15A, the electrodes 12 and 22 are not charged, and the distance between the first side arm 10 and its corresponding micro device 5 is h0. Under such circumstance, the one or multiple sensing elements 52 of the auxiliary board 50 are aligned with corresponding one or multiple micro devices 5, but are not in contact with the substrate which contains the one or multiple micro devices 5. In the second state depicted in FIG. 15B, the auxiliary board 50 is moved towards the substrate which contains the one or multiple micro devices 5 and the one or multiple sensing elements 52 are charged, while the micro device transfer head array 108 is moved within the sensing range of the corresponding micro device 5 and the electrodes 12 is charged (as indicated by arrow S1), wherein the distance between the first side arm 10 and the corresponding micro device 5 is h1 (h1<h0). In the third state depicted in FIG. 15C, the micro device transfer head array 108 is moved in the lateral direction (as indicated by arrow S2) so that the charged electrode 12 may draw the corresponding micro device 5 away from the substrate to move towards the space between the first side arm 10 and the second side arm 20 (as indicated by arrow S3). In the fourth state depicted in FIG. 15D, with the lateral movement of the micro device transfer head array 108 and under the attraction force induced by the charged electrode 12, the corresponding micro device 5 may be drawn into the space between the first side arm 10 and the second side arm 20. Meanwhile, the electrode 32 is charged to further draw the corresponding micro device 5 towards the base arm 30 to fully be accommodated inside the space between the first side arm 10 and the second side arm 20 (as indicated by arrow S4). In the fifth state depicted in FIG. 15E, when the sensing element 42 and the electrode 12 are then charged by voltages of opposite polarities, the induced attraction force shortens the distance between the base arm 31 and the base arm 35 so that the base arm 31 encounters deformation which changes the relative locations of both ends of the first side arm 10 and the second side arm 20 (d2>d1), thereby clamping the corresponding micro device 5 steadily.

FIGS. 16A-16D are diagrams illustrating the operation of the micro device transfer head arrays 110~112 according to embodiments of the present invention. For illustrative purpose, FIGS. 16A-16D depict the 4-state operation of the micro device transfer head array 110 with an auxiliary board 60. The auxiliary board 60 includes one or multiple bulging structures 62 each associated with a corresponding micro device 5. In the initial first state depicted in FIG. 16A, the electrodes 12 and 22 are not charged, and the distance between the first side arm 10 and its corresponding micro device 5 is h0. An edge-cutting procedure is performed on the substrate containing the one or more micro devices, thereby weakening the edges which define the one or more micro devices. The one or multiple sensing elements 52 of the auxiliary board 50 are aligned with corresponding one or multiple micro devices 5, but are not in contact with the substrate which contains the one or multiple micro devices 5. In the second state depicted in FIG. 15B, the auxiliary board 50 is moved towards the substrate which contains the one or multiple micro devices 5 so that one end of the one or multiple micro devices 5 may be jacked up. Meanwhile, the electrodes 12 is charged and the micro device transfer head array 110 is moved within the sensing range of the corresponding micro device 5 (as indicated by arrow S1) until the corresponding micro device 5 may be drawn into the space between the first side arm 10 and the second side arm 20 (as indicated by arrow S3). In the fourth state depicted in FIG. 16D, each adjusting arm 51 is applied with an upward force and each adjusting arm 53 is applied with an downward force so that the base arm 30 may encounter deformation which changes the relative locations of both ends of the first side arm 10 and the second side arm 20 (d2<d1), thereby clamping the corresponding micro device 5 stably.

In conclusion, the present invention provides a micro device transfer head array capable of mass-transferring micro LEDs rapidly and efficiently.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A micro device transfer head, comprising:
   a first base arm including a first surface and a second surface;
   a second base arm disposed on the second surface of the first base arm and including one or multiple sensing elements;
   a first side arm including one or multiple first electrodes and disposed on the first surface of the first base arm at a first end of the first base arm;
   a second side arm including one or multiple second electrodes and disposed on the first surface of the first base arm at a second end of the first base arm;
   an isolation layer disposed on the first surface of the first base arm and covering a surface of the first side arm and a surface of the second side arm;
   a first adjusting arm disposed on the second surface of the first base arm at a location corresponding to a space between the first side arm and the second side arm;
   a second adjusting arm disposed on the second surface of the first base arm at the first end of the first base arm; and
   a third adjusting arm disposed on the second surface of the first base arm at the second end of the first base arm.

2. The micro device transfer head of claim 1, wherein the first base arm further includes one or multiple third electrodes.

3. The micro device transfer head of claim 1, wherein the one or multiple sensing elements are one or multiple electrodes or electromagnetic coils.

4. The micro device transfer head of claim 1, wherein:
   the first side arm includes a first hook-shaped structure at an end which is farthest away from the first base arm; and
   the second side arm includes a second hook-shaped structure at an end which is farthest away from the first base arm.

* * * * *